(12) United States Patent
Peng et al.

(10) Patent No.: US 8,089,754 B2
(45) Date of Patent: Jan. 3, 2012

(54) COMPUTER SERVER SYSTEM AND SERVER THEREOF

(75) Inventors: Wen-Tang Peng, Taipei Hsien (TW); Mo-Ming Yu, Shenzhen (CN); Xiang-Wei He, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 167 days.

(21) Appl. No.: 12/750,683

(22) Filed: Mar. 30, 2010

(65) Prior Publication Data
US 2011/0122573 A1 May 26, 2011

(30) Foreign Application Priority Data
Nov. 24, 2009 (CN) .......................... 2009 1 0310311

(51) Int. Cl.
*G06F 1/20* (2006.01)
*H05K 7/20* (2006.01)

(52) U.S. Cl. .................. 361/679.48; 361/695; 361/716; 312/236; 454/184

(58) Field of Classification Search .. 361/679.48–679.5, 361/690, 694–695, 716; 312/223.2, 236; 454/184
See application file for complete search history.

(56) References Cited

U.S. PATENT DOCUMENTS

| | | | | |
|---|---|---|---|---|
| 6,040,981 | A * | 3/2000 | Schmitt et al. | 361/695 |
| 6,317,320 | B1 * | 11/2001 | Cosley et al. | 361/695 |
| 7,295,436 | B2 * | 11/2007 | Cheon | 361/699 |
| 7,403,390 | B2 * | 7/2008 | Franz et al. | 361/695 |
| 8,031,467 | B2 * | 10/2011 | Cheng et al. | 361/694 |
| 2006/0256522 | A1 * | 11/2006 | Wei et al. | 361/695 |
| 2009/0154092 | A1 * | 6/2009 | Chen | 361/679.51 |
| 2011/0216498 | A1 * | 9/2011 | Lee | 361/679.33 |

FOREIGN PATENT DOCUMENTS

| | | | |
|---|---|---|---|
| CN | 101296598 A | * | 10/2008 |
| CN | 201465019 U | * | 5/2010 |
| JP | 2009105256 A | * | 5/2009 |
| JP | 2010199134 A | * | 9/2010 |

* cited by examiner

*Primary Examiner* — Robert J Hoffberg
(74) *Attorney, Agent, or Firm* — Altis Law Group, Inc.

(57) ABSTRACT

A server of a computer server system includes an enclosure and a fan module located outside the enclosure. The enclosure includes a sidewall defining a plurality of ventilating holes therein. The fan module includes a tray and a fan mounted on the tray. The fan module is pivotally mounted relative to the sidewall of the enclosure, and the fan module is capable of being pivoted from a horizontal state to a vertical state relative to the server.

18 Claims, 6 Drawing Sheets

COMPUTER SERVER SYSTEM AND SERVER THEREOF

BACKGROUND

1. Technical Field

The present disclosure relates to a computer server system, and more particularly to a server of the computer server system.

2. Description of Related Art

Computer server systems are commonly used to process and store data and information in networks in the art. Typically, a computer server system includes a cabinet and multiple servers mounted in the cabinet. Each of the servers includes an enclosure, a plurality of electronic components and fans accommodated in the enclosure. The fans are configured for cooling the heat generated by the electronic components during operation.

As information technology continues to rapidly progress, old servers are continually required to be updated with new ones, to enhance the processing capacity of the computer server system. In this situation, the fans in the old servers are discarded together with the fans installed therein whether they are competent or not in heat dissipating for the new servers because the new servers generally have an internal layout different from that of the old servers. Thus, it is a waste for the fans, and accordingly the cost for updating the servers is increased.

Accordingly, what is desired is a server of a computer server system which can overcome the above-described limitations.

DETAILED DESCRIPTION

Figure 1:
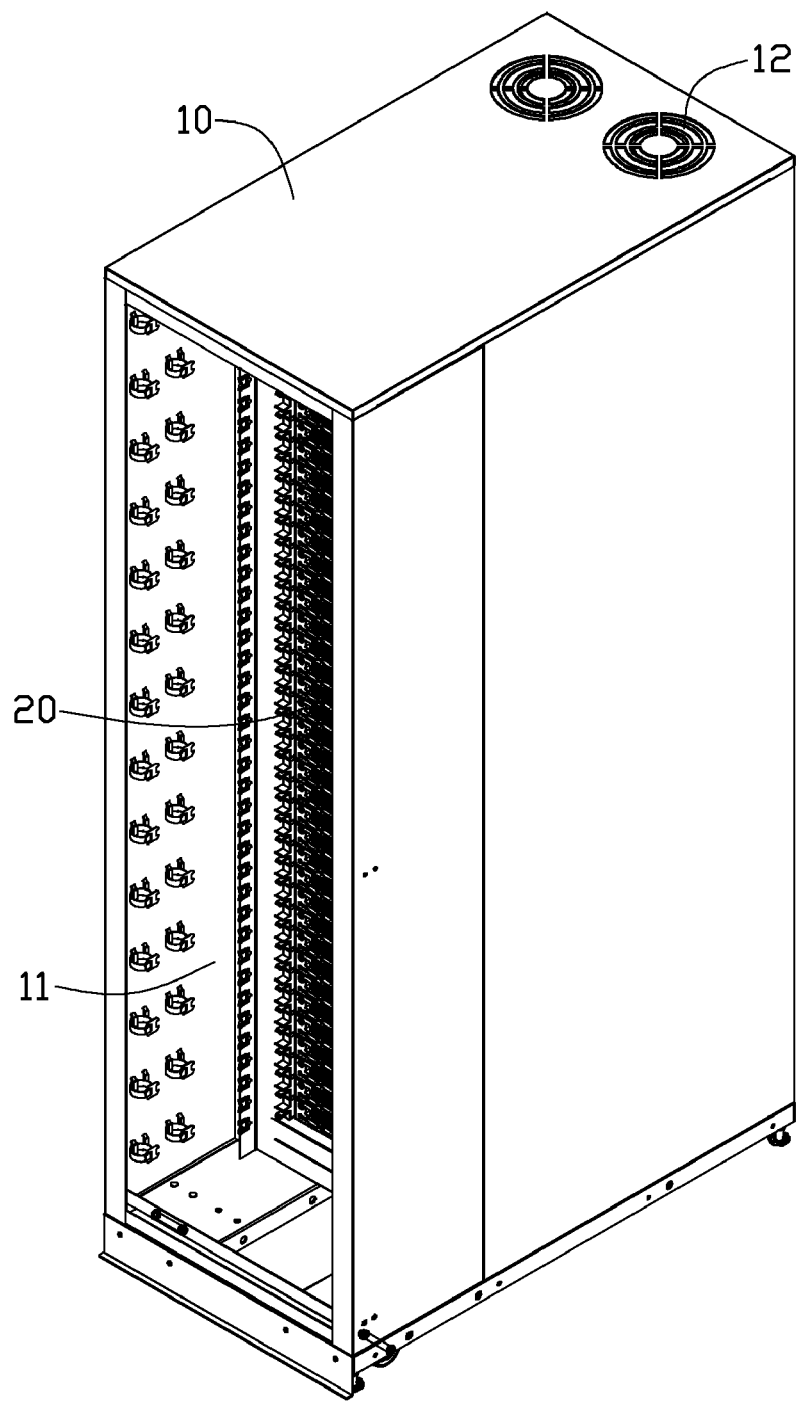
FIG. 1 is an isometric, assembled view of a computer server system in accordance with an embodiment of the present disclosure.

Reference will now be made to the drawing figures to describe the present computer server system in detail.

Referring to FIG. 1, a computer server system according an embodiment of the present disclosure is shown. The computer server system includes a cabinet 10, and a plurality of servers 20 stacked in the cabinet 10.

The cabinet 10 is a hollow metallic cuboid housing. In FIG. 1, a front plate (not shown) of the cabinet 10 is removed for clarity. An access port 11 is defined in front of the cabinet 10. Each of the servers 20 is flat and inserted into the cabinet 10 through the access port 11. The servers 20 are parallel to each other and stacked in the cabinet 10 bottom-to-top. Two ventilating holes 12 are defined in top of the cabinet 10. Heat dissipation fans (not shown) can be configured to align with each of the ventilating holes 12 for accelerating air exchange between the inner side of the cabinet 10 and the outside of the cabinet 10.

Figure 2:
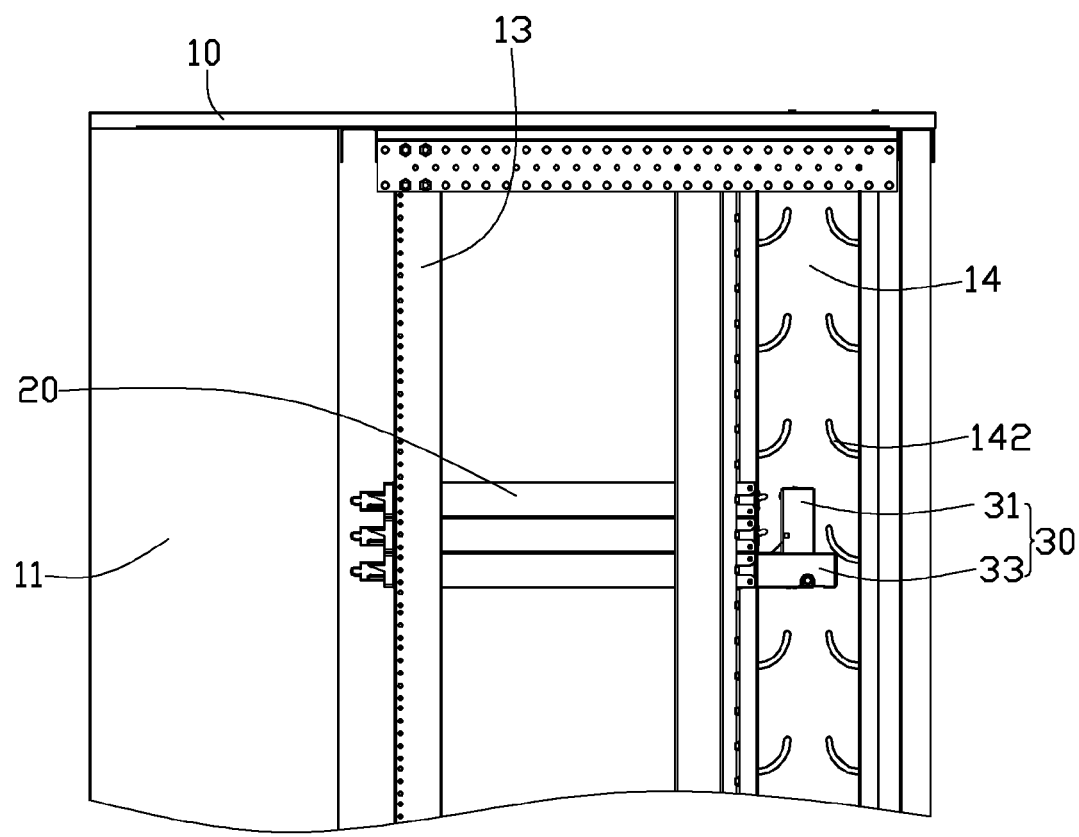
FIG. 2 is a partial, schematic view of an inner structure of the computer server system of FIG. 1.

Referring to FIG. 2, the cabinet 10 is provided with a rack 13 mounted therein for mounting the servers 20. The rack 13 includes two guiding members 14 located at rear of the cabinet 10. The two guiding members 14 are located at two opposite sides of the servers 20 respectively, and are elongated and extending along a stacking direction of the servers 20.

Figure 3:
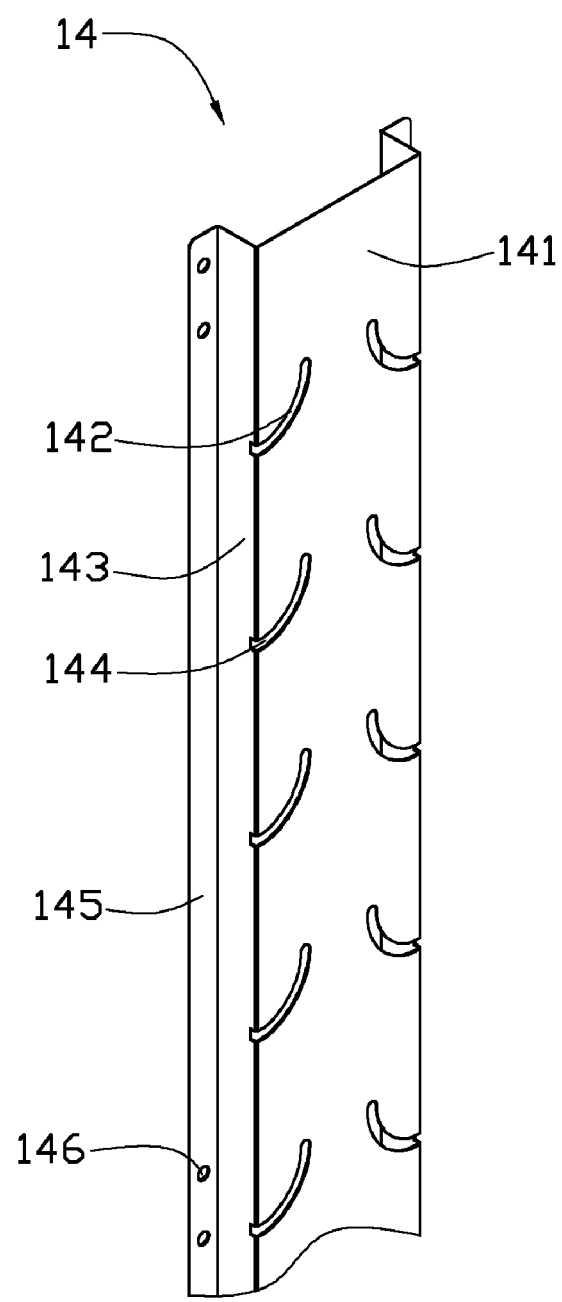
FIG. 3 is a partial, isometric view of a guiding member of the computer server system of FIG. 2.

Referring to FIG. 3, each of the guiding members 14 includes an elongated guiding plate 141, two flanges 143 respectively extending from two opposite sides of the guiding plate 141, and two mounting edges 145 respectively extending from the two flanges 143. A surface of the guiding plate 141 is parallel with the direction that the servers 20 are inserted into the cabinet 10. In the embodiment, the guiding plates 141 attach to left and right plates (not labeled) of the cabinet 10, respectively. Two rows of guiding slots 142 are respectively defined in the two opposite sides of the guiding plate 141 along the height direction of the guiding member 14. The guiding slots 142 are arc-shaped, and extend gradually upwardly from two lateral sides of the guiding plate 141 towards a top of the guiding member 14. The guiding slots 142 are evenly spaced from each other. In this embodiment, a distance between every two adjacent guiding slots 142 in the same row is three times as the height of a single server 20. The two rows of guiding slots 142 are symmetrical with each other, whereby each of the two guiding members 14 can be mounted on the left plate or the right plate of the cabinet 10. Each of the flanges 143 of the guiding member 14 defines a plurality of entrances 144, corresponding to the guiding slots 142. Each of the entrances 144 aligns with a corresponding guiding slot 142 of the guiding plate 141 and communicates with the corresponding guiding slot 142. Each of the mounting edges 145 defines a plurality of mounting holes 146, mounting the guiding member 14 in the cabinet 10.

Figure 4:
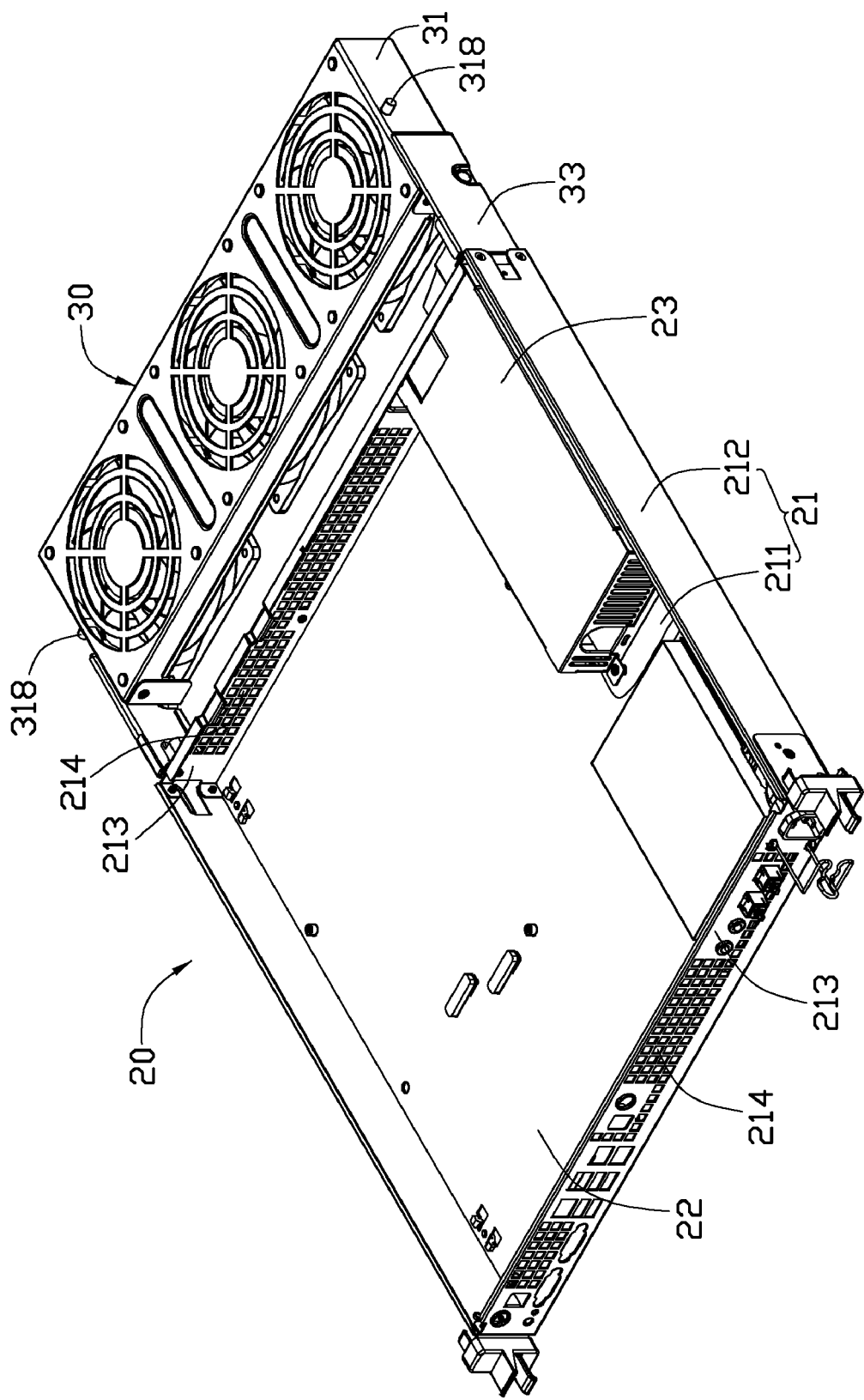
FIG. 4 is an isometric view of a server of the computer server system of FIG. 1 in a first state.

Referring to FIG. 4, each of the servers 20 includes an enclosure 21, a circuit board 22 mounted in the enclosure 21, and a plurality of electronic components 23 such as processors mounted on the circuit board 22. The enclosure 21 includes a rectangular base plate 211, left and right sidewalls 212 extending upwardly respectively from left and right on lateral sides of the base plate 211, and front and rear sidewalls 213 extending upwardly respectively from front and rear on lateral sides of the base plate 211. The front and rear sidewalls 213 define a plurality of ventilating holes 214. A fan module 30 is provided outside the enclosure 21 and mounted to the rear sidewall 213 of the server 20.

Figure 5:
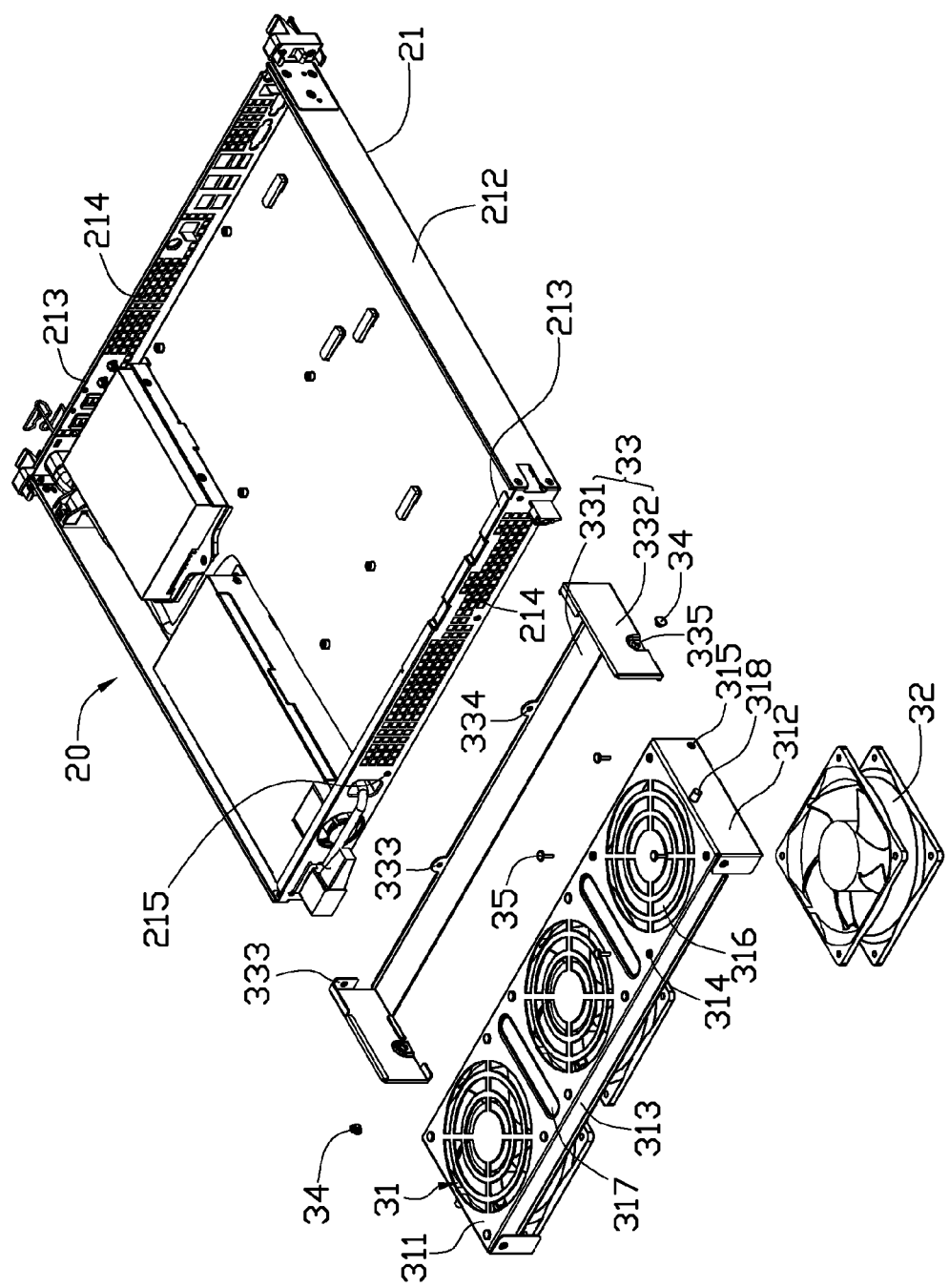
FIG. 5 is an exploded view of the server of FIG. 4.

Referring to FIG. 5, the fan module 30 includes a rectangular tray 31, three fans 32 mounted on the tray 31, a mounting bracket 33 for mounting the tray 31 on the server 20, two pivots 34, and a plurality of fasteners 35.

The tray 31 includes a rectangular mounting plate 311, two connecting plates 312 extending perpendicularly from the two opposite shorter lateral sides of the mounting plate 311 and two flanges 313 extending perpendicularly from the two opposite longer lateral sides of the mounting plate 311. The mounting plate 311, the connecting plates 312 and the flanges 313 cooperatively define a receiving space (not shown), receiving the three fans 32. The fans 32 are mounted on the mounting plate 311 and arranged in a row. The mounting plate 311 defines three ventilating holes 316 therein, corresponding to the three fans 32, wherein each of the fans 32 aligns with a corresponding ventilating hole 316. The mounting plate 311 further defines a plurality of threaded holes 314 around each of the ventilating holes 316 for the fasteners 35 to extend through to mount the fans 32 on the mounting plate 311. A rib 317 is formed on the mounting plate 311 between every two adjacent ventilating holes 316. Each of the ribs 317 is elongated and perpendicular to the two flanges 313 of the tray 31. The flange 313 and the rib 317 can enhance the mechanical strength of the mounting plate 311, whereby the tray 31 is capable of holding fans of a larger size. The two connecting plates 312 each define a through hole 315 at the end. A guiding pole 318 protrudes outwardly perpendicularly from a middle portion of each of the connecting plates 312.

The mounting bracket 33 includes a mounting beam 331 and two supporting arms 332 connected at two opposite ends of the mounting beam 331. The two supporting arms 332 are parallel to and face each other. A plurality of mounting ears are formed on the mounting beam 331 and the two supporting arms 332, respectively. Each of the mounting ears 333 defines a mounting hole 334. The rear sidewall 213 of the server 20 defines a plurality of threaded holes 215, corresponding to the mounting holes 334 of the mounting ears 333 of the mounting bracket 33 for mounting the mounting bracket 33 on the rear sidewall 213 of the server 20. Each of the two mounting arms 332 of the mounting bracket 33 defines a through hole 335, corresponding to the through hole 315 of the connecting plate 312 of the tray 31. The tray 31 is located between the two mounting arms 332. The through holes 315 of the two connecting plates 312 of the tray respectively align with the through holes 335 of the mounting arms 332 of the mounting bracket 33 for the two pivots 34 to extend through, respectively. Whereby, the tray 31 is pivotally mounted to the mounting bracket 33 between the two mounting arms 332.

Figure 6:
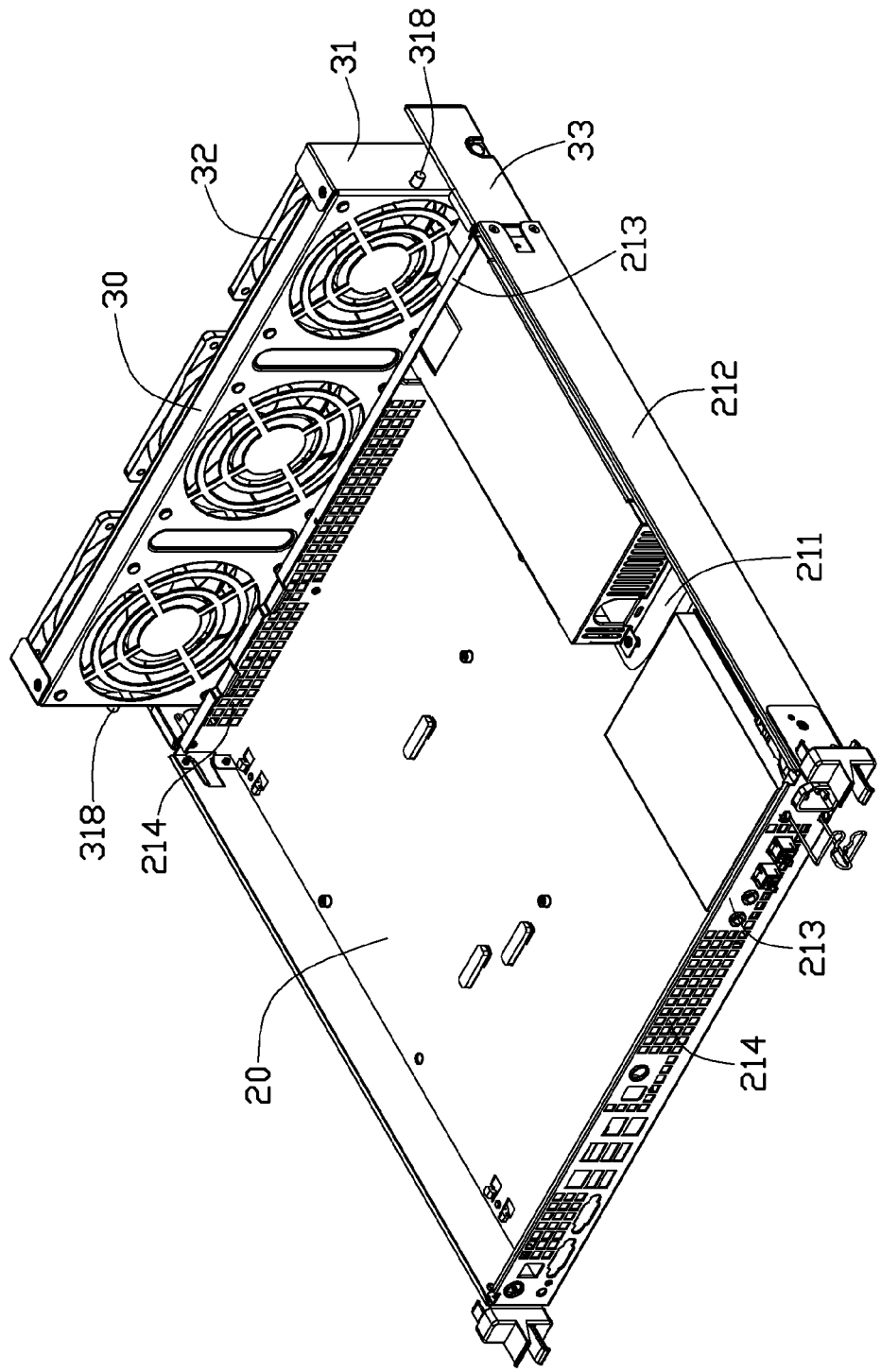
FIG. 6 is similar to FIG. 4, but showing the server in a second state.

In assembling the servers 20 into the cabinet 10 of the computer server system, the fan module 30 is adjusted to maintain the same plane with the corresponding server 20 as shown in FIG. 4, whereby the server 20 is inserted conveniently into the rack 13 of the cabinet 10 through the access port 11. When the server 20 is inserted into the rack 13, the fan module 30 enters the cabinet 10 from the access port 11 first, and the corresponding server 20 follows. As the fan module 30 approaches the two guiding members 14, the two guiding poles 318 of the tray 31 respectively enter corresponding guiding slots 142 of the guiding members 14 from corresponding entrances 144 of the guiding members 14. The server 20 is pushed further into the cabinet 10 of the computer server system. This causes the tray 31 of the fan module 30 to rotate upwardly along the corresponding guiding slots 142 of the guiding members 14 until the guiding poles 318 of the tray 31 reach a top end of the corresponding guiding slots 142. In this state, the tray 31 of the fan module 30 is erected to be perpendicular to the enclosure 21 of the server 20 where the fan module 30 is mounted, as shown in FIG. 2 and FIG. 6. Other servers 20 without fan module 30 if needed can be stacked above the server 20 with the fan module 30 until the other servers 20 exceeds the height of the tray 31 of the fan module 30 above the enclosure 21. Whereby, multiple neighboring servers 20 can commonly share the fan module 30 in the computer server system. In this embodiment, the height of the tray 31 of the fan module 30 is three times the height of the single server 20, so that the fan module 30 can be commonly shared by three neighboring servers 20 (referring to FIG. 2).

In the present embodiment, the fan module 30 is disposed outside the server 20. An internal layout of the server 20 is irrelevant to the installation of the fan module 30. Thus, when the servers 20 are updated with new ones, the fan module 30 can continue to be used on new servers 20, thereby saving money and reducing cost. Furthermore, since the fans 32 are mounted to the outside of the server 20, fans with greater size can be used to provide a more powerful airflow. Also, if a single fan 32 of the fan module 30 is damaged, the damaged fan 32 can be easily substituted by a new one without opening the enclosure 21 of the server 20. In addition, multiple neighboring servers 20 in the cabinet 10 can commonly share a single fan module 30, thereby reducing the assembly process.

It is to be understood, however, that even though numerous characteristics and advantages of the present disclosure have been set forth in the foregoing description, together with details of the structure and function of the embodiments. The disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A server of a computer server system, comprising:
an enclosure comprising a sidewall, the sidewall defining a plurality of ventilating holes therein;
a fan module located outside the enclosure, the fan module comprising a tray and at least one fan mounted on the tray, the tray of the fan module being mounted pivotally relative to the sidewall of the enclosure such that the fan module is capable of being pivoted from a horizontal state to a vertical state relative to the server; and
at least one guiding pole is formed on the tray and configured for guiding the tray to rotate from the horizontal state to the vertical state.

2. The server of claim 1, wherein the fan module further comprises a mounting bracket, the mounting bracket is mounted to the sidewall of the enclosure, and the tray is pivotally mounted to the mounting bracket.

3. The server of claim 2, wherein a plurality of mounting ears are formed on the mounting bracket, each mounting ear of the plurality of mounting ears defines a mounting hole, the mounting bracket is mounted to the sidewall of the enclosure through the plurality of mounting ears.

4. The server of claim 2, wherein the mounting bracket comprises a mounting beam and two mounting arms formed at two opposite ends of the mounting beam, the tray is mounted between the two mounting arms.

5. The server of claim 4, wherein the tray comprises a mounting plate and two connecting plates formed at two opposite lateral sides of the mounting plate, the at least one fan is mounted on the mounting plate, the mounting plate defines at least one ventilating hole corresponding to the at least one fan, the at least one fan aligns with the at least one ventilating hole, and the two connecting plates of the tray are respectively pivotally mounted to the two mounting arms of the mounting bracket.

6. The server of claim 5, wherein two flanges are respectively formed on the other two opposite lateral sides of the mounting plate, and at least one rib is formed on the mounting plate, the at least one rib is elongated and perpendicular to the two flanges.

7. The server of claim 1, wherein the at least one guiding pole comprises two guiding poles formed at two opposite ends of the tray and extend outwardly from the tray.

8. The server of claim 7, wherein the tray comprises a mounting plate and two connecting plates formed at two opposite lateral sides of the mounting plate, the at least one fan is mounted on the mounting plate, and the two guiding poles are respectively formed on the two connecting plates of the tray.

9. The server of claim 1, wherein when the fan module is located in the vertical state, the fan module has a height of at least two times as a height of the server and the fan module is capable of being commonly shared by the server and at least two neighboring servers to the server.

10. A computer server system, comprising:
- a cabinet, the cabinet including at least one guiding member provided in the cabinet, the guiding member defines a plurality of guiding slots therein, the plurality of guiding slots each are arc-shaped;
- a plurality of servers received in the cabinet, each of the plurality of servers comprising an enclosure, the enclosure comprising a sidewall, the sidewall defining a plurality of ventilating holes, at least one of the plurality of servers of the plurality of servers being provided with a fan module mounted outside the enclosure of each of the at least one of the servers, the fan module comprising a tray and at least one fan mounted on the tray, the tray of the fan module being mounted pivotally relative to the sidewall of the enclosure such that the fan module is capable of being pivoted from a horizontal state to a vertical state relative to the each of the at least one of the servers; and
- at least one guiding pole is formed on the fan module, the at least one guiding pole of the fan module enters a corresponding guiding slot of the plurality of guiding slots and moves along the corresponding guiding slot to guide the fan module to rotate the fan module from the horizontal state to the vertical state.

11. The computer server system of claim 10, wherein the at least one guiding member comprises a guiding plate, the guiding plate is mounted at a lateral side of the plurality of servers, the plurality of guiding slots are defined in the guiding plate along a height direction of the cabinet.

12. The computer server system of claim 11, wherein the guiding slots are arranged in two columns respectively at two opposite lateral sides of the guiding plate.

13. The computer server system of claim 12, wherein two flanges are formed at the two opposite lateral sides of the guiding plate, each of the two flanges defines a plurality of entrances therein corresponding to the guiding slots, each of the plurality of entrances aligns with a corresponding guiding slot of the guiding slots and communicates with the corresponding guiding slot, and the at least one guiding pole of the fan module enters the corresponding guiding slot through a corresponding entrance of the plurality of entrances of the flange.

14. The computer server system of claim 10, wherein the tray comprises a mounting plate and two connecting plates extending from two opposite lateral sides of the mounting plate, the at least one fan is mounted on the mounting plate, the mounting plate defines at least one ventilating hole corresponding to the at least one fan, and the at least one guiding pole is formed on at least one of the two connecting plates.

15. The computer server system of claim 14, wherein the fan module further comprises a mounting bracket, the mounting bracket comprises a mounting beam and two mounting arms formed at two opposite ends of the mounting beam, the tray is pivotally mounted between the two mounting arms, the mounting bracket is mounted to the sidewall of the one of the servers.

16. The computer server system of claim 10, wherein the at least one guiding pole comprises two guiding poles formed at two opposite sides of the tray and the two guiding poles are extended outwardly from the tray.

17. The computer server system of claim 16, wherein the tray comprises a mounting plate and two connecting plates formed at two opposite lateral sides of the mounting plate, the at least one fan is mounted on the mounting plate, and the two guiding poles are respectively formed on the two connecting plates of the tray.

18. The computer server system of claim 10, further comprises at least two neighboring servers of the plurality of servers, the two neighboring servers are adjacent to the each of the at least one of the servers, wherein when the fan module is located in the vertical state, the fan module has a height of at least two times as a height of the each of the at least one of the servers and the fan module is capable of being commonly shared by the each of the at least one of the servers and the at least two neighboring servers.

* * * * *